(12) United States Patent
Chen et al.

(10) Patent No.: US 6,482,301 B1
(45) Date of Patent: Nov. 19, 2002

(54) TARGET SHIELDS FOR IMPROVED MAGNETIC PROPERTIES OF A RECORDING MEDIUM

(75) Inventors: Qixu Chen, Milpitas, CA (US); Charles Leu, Fremont, CA (US); Mark Anthony Shows, Fremont, CA (US); Paul Stephen McLeod, Berkeley, CA (US); Rajiv Yadav Ranjan, San Jose, CA (US)

(73) Assignee: Seagate Technology, Inc., Scotts Valley, CA (US)

( * ) Notice: Subject to any disclaimer, the term of this patent is extended or adjusted under 35 U.S.C. 154(b) by 0 days.

(21) Appl. No.: 09/326,245

(22) Filed: Jun. 4, 1999

Related U.S. Application Data

(60) Provisional application No. 60/088,330, filed on Jun. 4, 1998.

(51) Int. Cl.[7] .................................... C23C 14/32
(52) U.S. Cl. ........................ 204/298.11; 204/192.12; 204/192.2
(58) Field of Search .................. 204/298.11, 192.12, 204/192.2

(56) References Cited

U.S. PATENT DOCUMENTS

| | | | |
|---|---|---|---|
| 4,824,544 A | | 4/1989 | Mikalsen et al. |
| 4,931,158 A | * | 6/1990 | Bunshah et al. ....... 204/192.12 |
| 5,223,108 A | | 6/1993 | Hurwitt |
| 5,330,628 A | * | 7/1994 | Demaray et al. ...... 204/192.12 |
| 5,415,753 A | | 5/1995 | Hurwitt et al. |
| 5,616,218 A | * | 4/1997 | Alex ....................... 204/192.2 |
| 5,643,428 A | | 7/1997 | Krivokapic et al. |
| 5,683,561 A | | 11/1997 | Hollars et al. |
| 5,744,016 A | * | 4/1998 | Yamada et al. ........ 204/298.11 |
| 5,804,046 A | * | 9/1998 | Sawada et al. ........ 204/298.11 |
| 6,139,695 A | * | 11/2000 | Washburn et al. ...... 204/192.12 |

FOREIGN PATENT DOCUMENTS

| | | | |
|---|---|---|---|
| JP | 5-311419 | 11/1993 | ........... C23C/14/34 |
| JP | 5-326426 | 12/1993 | ......... H01L/21/205 |

* cited by examiner

*Primary Examiner*—Mark F. Huff
*Assistant Examiner*—Daborah Chacko-Davis
(74) *Attorney, Agent, or Firm*—Fliesler Dubb Meyer & Lovejoy LLP

(57) ABSTRACT

A collimator system is disclosed for use in an in-line pass-by sputtering system during the fabrication of recording media to improve the data storage density and read/write performance characteristics of the media. The collimator system includes a collimator shield and a collimator honeycomb. The shield includes a rectangular tube having a flange and a frame at inner and outer ends, respectively. The various components of the shield in part serve to prevent possible contamination of substrates due to target atom accumulation on the chamber walls during the sputtering process. The collimator honeycomb is provided for blocking target atoms from contacting the substrate at low incident angles. The collimator honeycomb is comprised of a plurality of collimators which are identical to each other. In a preferred embodiment, the collimators have a hexagonal cross-section taken from a perspective perpendicular to the substrate. The collimators may also have other geometric shapes. It is also contemplated that more than one collimator honeycomb level be used in alternative embodiments.

13 Claims, 5 Drawing Sheets

TARGET SHIELDS FOR IMPROVED MAGNETIC PROPERTIES OF A RECORDING MEDIUM

CLAIM OF PRIORITY

This application claims the benefit of U.S. Provisional Application No. 60/088,330 filed on Jun. 4, 1998.

BACKGROUND OF THE INVENTION

1. Field of the Invention

The present invention is generally related to the fabrication of recording media for use in hard disk drives, and in particular to a collimator system for use in an in-line pass-by sputtering system during the fabrication of recording media to improve the data storage density and read/write performance characteristics of the media.

2. Description of Related Art

Thin film magnetic disks and disk drives are conventionally employed for storing large amounts of data in magnetizable form. Data are written onto and read from a rapidly rotating recording disk by means of a magnetic head transducer assembly that flies closely over the surface of the disk. The escalating requirements for high areal recording density in increasingly smaller disk drives impose increasing demands on thin film magnetic recording media in terms of signal modulation, coercivity (Hr), coercivity squareness (S'), signal-to-medium noise ratio (SMNR), and the sharpness of the output signal of the medium. Considerable effort has been spent in recent years to produce magnetic recording media having higher recording densities and satisfying such demanding requirements, particularly for longitudinal recording.

Sputtering is a common process for depositing thin films onto substrate surfaces. The substrate (e.g., a glass-ceramic material) is typically a planar disk that is positioned in a vertical pallet which passes through a sputtering chamber. This is called in-line pass-by sputtering. A planar target is positioned vertically within the chamber, and spaced apart in a counterfacing relation with the substrate. The target is made of the material that is to be sputtered onto the substrate surface.

Examples of target material that are sputtered onto the substrate to form the recording media include chromium (Cr) or a Cr-containing underlayer, a cobalt (Co) or Co-containing magnetic layer, and a protective carbon (C) overcoat. There also may be a nickel aluminum (NiAl) seed layer between the underlayer and the substrate. The seed layer, underlayer, magnetic layer and overcoat are typically deposited on the substrates in the sputtering system which contains sequential deposition chambers.

Referring to FIG. 1, fundamentally, sputtering involves bombarding the surface of a target material 20 to be deposited as the film with electrostatically accelerated argon ions. Generally, magnetic fields are used to trap electrons in a plasma gas, causing a dense concentration of ions to impinge on the target surface. As a result of momentum transfer, atoms (22, 24 and 32) are dislodged from the target surface in an area known as the erosion region. The dislodged particles follow a generally linear trajectory from their point of emission on the target surface to a collision point on the juxtaposed surface of the substrate 26. Physical adhesion mechanisms cause the target particles to bond to the surface of the substrate, thereby forming a film on the substrate. In addition to achieving high film deposition rates, sputtering offers the ability to tailor film properties to a considerable extent.

It is extremely important in the fabrication of high density/high performance magnetic disks that the process parameters be controlled to ensure the deposited films exhibit the desired properties. However, typical sputtering systems of the type discussed above present certain problems, in that the sputtered layers may show significant crystal anisotropy and/or variations in layer thickness. When the substrate is moving in-line past a target, it is desirable that atoms impact the substrate at or near perpendicular to the surface of the substrate, such as atom 22. However, it may happen that atoms are emitted that hit the surface of the substrate at oblique angles, such as atom 24. Atoms which repeatedly hit the substrate at oblique angles may build upon previous atoms so that crystalline structures 28 (shown in FIG. 2) are formed that create shadow effects on the substrate that cut off the deposition of atoms near the crystalline structures.

The formation of the crystalline structures, as well as non-uniformity of the deposited layers in general, creates several problems. For example, such crystalline growth can result in anisotropy in the direction of disk travel through the in-line processes. Such anisotropy in the chromium underlayer and/or magnetic layer can significantly reduce storage density and read/write performance of the finished product. Anisotropy in the underlayer can disrupt the subsequent deposition of the magnetic layer in the preferred orientation. Similarly, anisotropy within the magnetic layer, among other things, can lead to a variance and reduction of the coercivity in the magnetic layer. Coercivity is a measure of the magnetic energy necessary to demagnetize a medium from its remanent magnetic state. Moreover, variations in the thickness of the sputtered magnetic layer, as well as variations in coercivity will also lead to signal modulation within the recording media. Signal modulation refers to variations in the signal received by the head during a read cycle.

Poor coercivity resulting from the formation of crystalline structures and non-uniformity of the deposited magnetic layers also adversely effects signal sharpness and signal-to-medium noise ratio. A reversal of polarization between adjacent, oppositely magnetized segments on a medium cannot happen instantaneously. Signal sharpness is a measure of how quickly or sharply this reversal of polarization takes place. Lower coercivities result in a slower and less sharp transition between oppositely magnetized segments, and consequently lower linear densities. Additionally, noise in magnetic recording media is greatest in the transition region between adjacent, oppositely magnetized segments on the media. Therefore, the large transition regions resulting from lower coercivities also increases the noise in the media and degrades the signal-to-media noise ratio.

One conventional method of controlling film deposition on the disk substrate is to locate a shield 30 within the field between the target and the substrates. The shield is preferably formed of a plurality of substantially planar surfaces of minimal thickness in the shape of a rectangular tube. With such an orientation, target atoms in substantially perpendicular paths will reach the substrate without contacting the shield, but target atoms (such as atom 32) traveling along substantially oblique paths will contact the shield and will be blocked from reaching the substrate. α1 represents a smallest incident angle possible employing the conventional shield.

Typically, α1 is approximately 28.5 degrees. It is however a problem with the conventional shield that angles of incidence this low still allow the formation of the crystalline structures, and does not prevent non-uniformity of the deposited layers in general.

It is also possible to enhance the magnetic properties of the media and reduce the modulation by circumferential scratching or employing a high argon pressure in the chamber. However, circumferential scratching can not be used when a glass or glass-ceramic substrate is being used. Furthermore, while reducing the modulation, the high argon pressure also reduces the coercivity.

SUMMARY OF THE INVENTION

It is therefore an advantage of the present invention to provide a magnetic recording medium allowing improved storage density and performance by exhibiting a low signal modulation, a high coercivity, a high coercivity squareness, a high signal-to-medium noise ratio, and a high sharpness of the output signal.

It is a further advantage of the present invention to provide a collimator system for use in a sputter apparatus that prevents atoms from the target from depositing on the substrate at low incident angles.

It is a still further advantage of the present invention to provide a collimator system for improving storage density and performance which may be easily incorporated into existing deposition shields.

These and other advantages are provided by the present invention, which in a preferred embodiment relates to a collimator system for use in an in-line pass-by sputtering system during the fabrication of recording media to improve the data storage density and read/write performance characteristics of the media. The collimator system includes a collimator shield and a collimator honeycomb. The shield includes a rectangular tube having a flange and a frame at inner and outer ends, respectively. The various components of the shield in part serve to prevent possible contamination of substrates due to target atom accumulation on the chamber walls during the sputtering process.

The collimator honeycomb is provided for blocking target atoms from contacting the substrate at low incident angles. The collimator honeycomb is comprised of a plurality of collimators which are identical to each other. In a preferred embodiment, the collimators have a hexagonal cross-section taken from a perspective perpendicular to the substrate. The collimators may also have other geometric shapes. It is also contemplated that more than one collimator honeycomb level be used in alternative embodiments.

BRIEF DESCRIPTION OF THE DRAWINGS

The present invention will now be described with reference to the drawings, in which.

DETAILED DESCRIPTION OF THE PREFERRED EMBODIMENTS

The invention will now be described with reference to FIGS. 3 through 10, which show a collimator system and characteristics of the collimator system. The collimator system of the present invention shall be described herein with regard to in-line pass-by PVD sputtering of thin films onto substrates to form recording media for hard disk drives. However, it is understood that the present invention may be used with static PVD sputtering, and deposition processes other than PVD sputtering.

Figure 1:
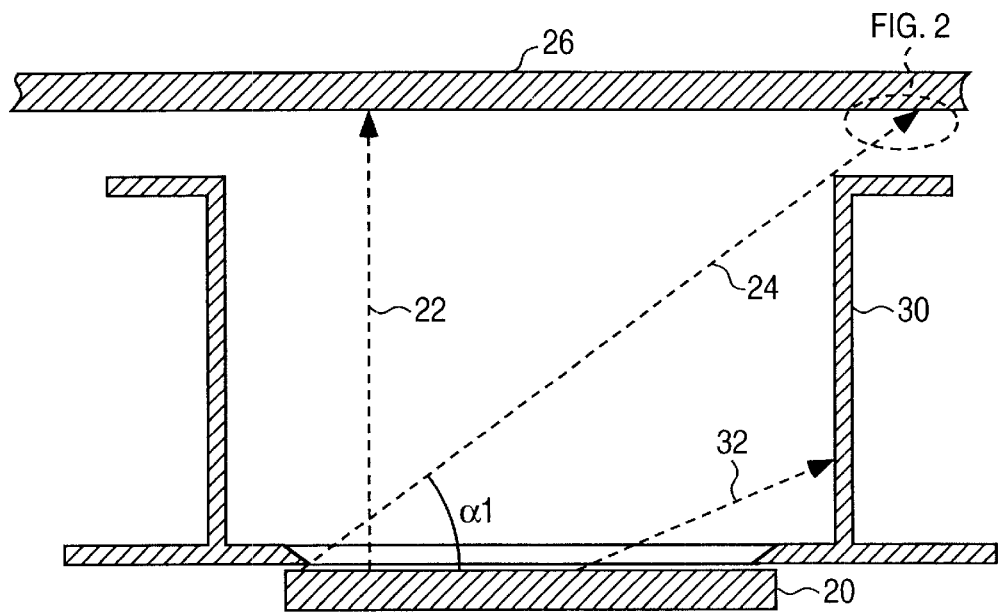
FIG. 1 is a cross-section view of a conventional shield used during the sputtering of thin films onto substrates.
Figure 2:
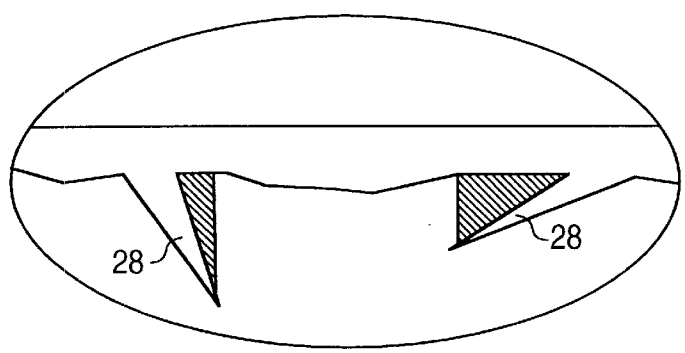
FIG. 2 is an enlarged view showing the crystalline structures which form during conventional sputtering processes.
Figure 3:
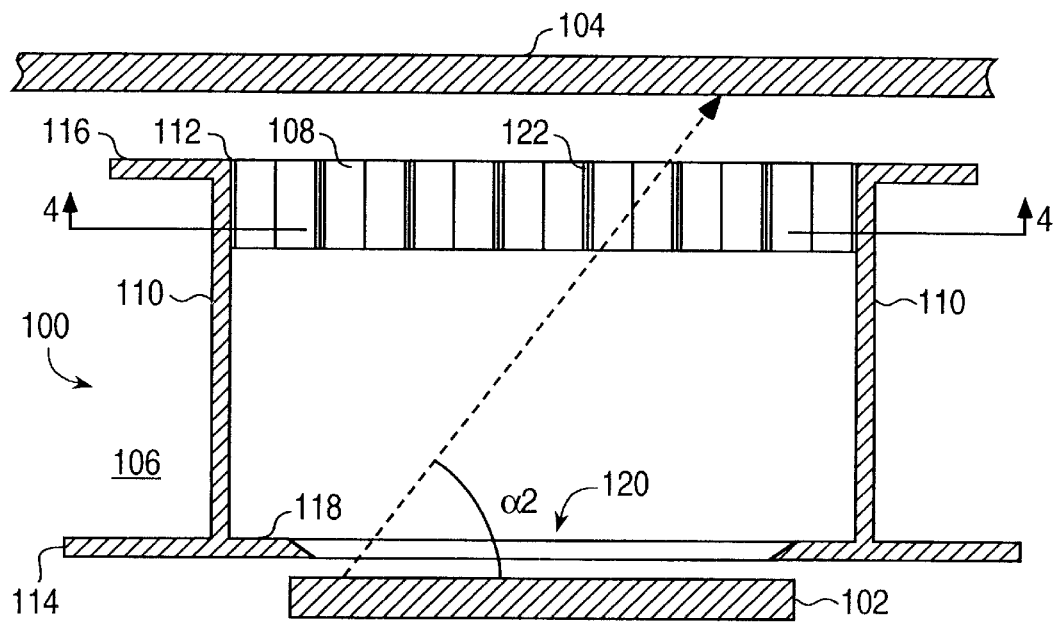
FIG. 3 is a cross-section view of a collimator according to the present invention used during the sputtering of thin films onto substrates.
Figure 4:
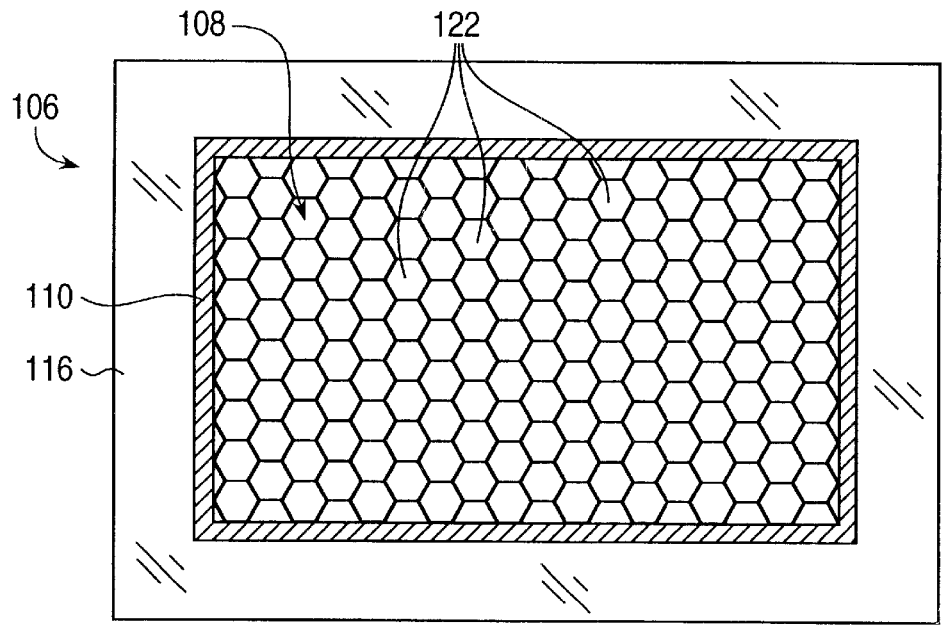
FIG. 4 is a cross-section view through line 4—4 in FIG. 3.
Figure 5:
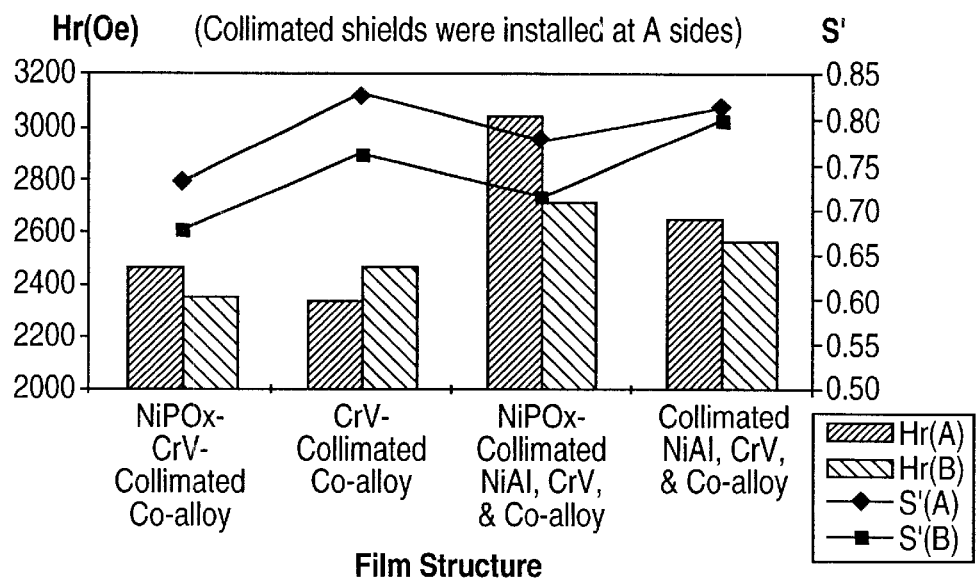
FIG. 5 is a chart comparing the coercivity (Hr) and coercivity squareness (S') of a substrate deposited with a conventional shield and the collimator system according to the present invention.
Figure 6:
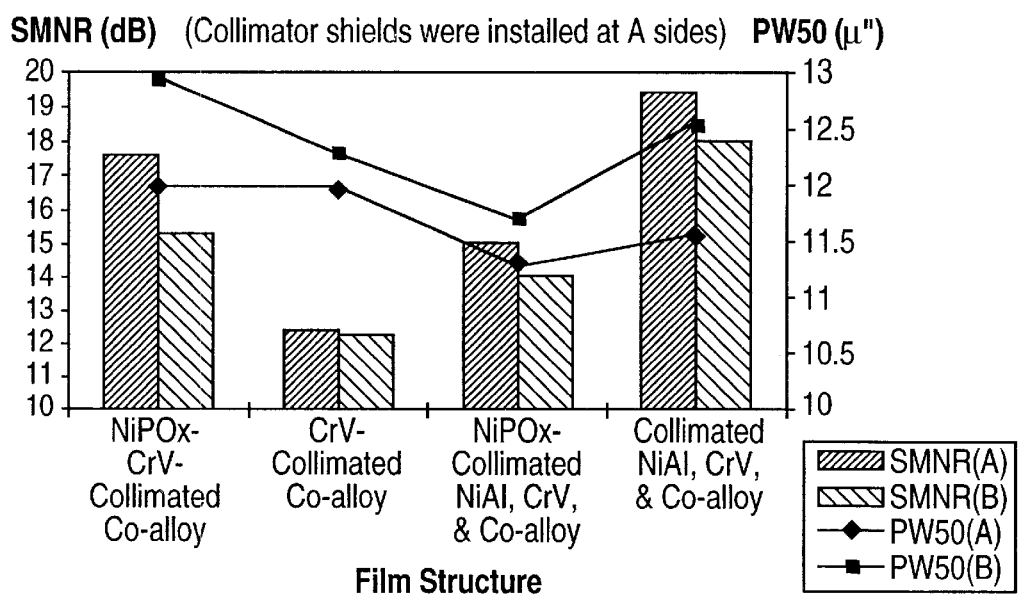
FIG. 6 is a chart comparing the signal-to-medium noise ratio (SNMR) of a substrate deposited with the conventional shield and the collimator system according to the present invention.
Figure 7:
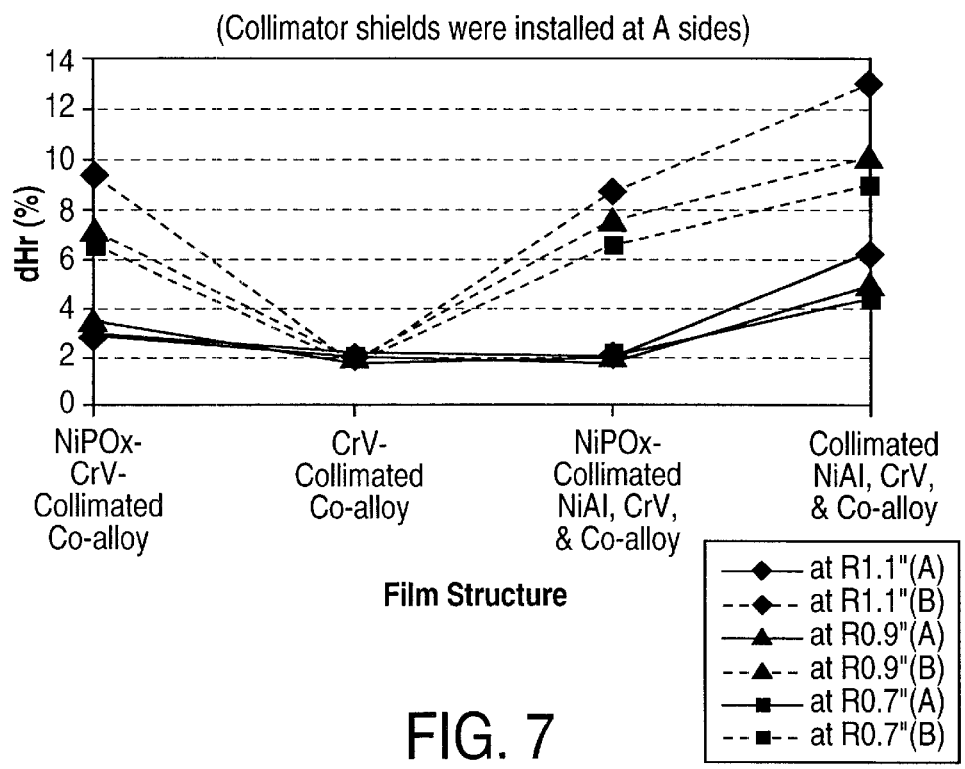
FIG. 7 is a graph comparing the relative variation of the coercivity along one track (dHr) of a substrate deposited with the conventional shield and the collimator system according to the present invention.
Figure 8:
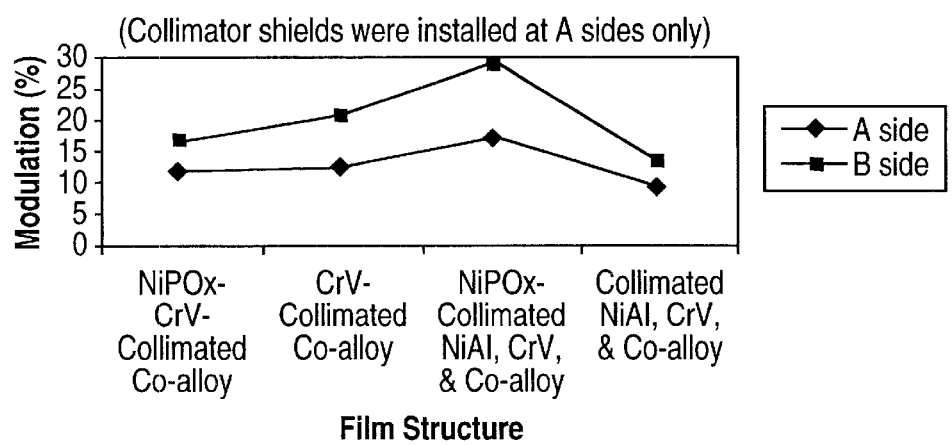
FIG. 8 is a graph comparing the signal modulation of a substrate deposited with the conventional shield and the collimator system according to the present invention.

Referring now to FIGS. 3 and 4, there is shown a collimator 100 according to a preferred embodiment of the present invention located between a target 102 and glass-ceramic substrate 104. The substrate is secured in a vertical pallet which travels through an in-line pass-by PVD sputtering system. Although one collimator 100 is shown in FIGS. 3 and 4, it is understood that a sputtering chamber may include two such collimators in front of two targets so that controlled deposition may be performed on both sides of the substrate. It is contemplated that a sputtering chamber include only one such collimator in alternative embodiments. Moreover, it is understood that an in-line pass-by sputtering system may include a plurality of sputtering chambers for sputtering a plurality of layers onto the substrate. Each such chamber may include one or two collimators 100. An example of an in-line pass-by sputtering system in which the present invention may be used is disclosed in U.S. Pat. No. 5,683,561, entitled "Apparatus and Method for High Throughput Sputtering", which Patent is assigned to the owner of the present invention and which Patent is incorporated by reference herein in its entirety.

FIGS. 3 and 4 cross-sectional views of the collimator 100, respectively. Although not critical to an understanding of the present invention, the target 102 and the substrate 104 are generally planar members oriented generally parallel to each other in a vertical x-z plane. The target is generally of a substantially rectangular shape having a height comparable in size to the pallet height. In one embodiment of the invention, the target has a height of approximately 374 mm and a width of approximately 91 mm. The substrate is generally a disk-shaped member and secured in the pallet during the in-line pass-by PVD sputtering process. For a target having the dimensions described above, the substrate may have a diameter of approximately 130 mm and a thickness of approximately 1.27 mm. It is understood that both the shape and size of the substrates and target may vary in alternate embodiments of the present invention. It is also understood that the substrates and target may be formed of various materials. For example, the substrates may be formed of glass or glass-ceramic materials. The target may be formed of various materials including for example, metals such as aluminum (Al), chromium (Cr), nickel (Ni), cobalt (Co) and alloys or compounds of these materials.

Emission-inducing energy is applied to an active face of the target in the form of, for example, a plasma containing accelerated argon ions. A power source (now shown) may be coupled to the target in order to provide the source of the accelerated argon ions. As is known in the art, confinement magnets (not shown) may also be provided adjacent the target for trapping the electrons near the surface of the target, to thereby increase and more evenly distribute ion bombardment at the target.

As a result of the ion bombardment of the target, target atoms are dislodged from the target and travel linearly away from the target. As previously described, it is desirable for those target atoms contacting the surface of the substrate to travel along or near a substantially perpendicular path between the target and substrate. However, the dislodged target atoms typical travel away form the target along various and random flight paths. As described in the Background of the Invention section, target atoms reaching the substrate at low incident angles increase the likelihood of crystal anisotropies, which in turn may result in low storage densities and poor read/write performance.

In order to prevent target atoms traveling along a substantially oblique path from reaching the target, the collimator 100 according to the present invention intercepts atoms traveling from the target at low incident angles. To ensure that the collimator 100 is effective over the height of the pallet, the height of the collimator system is preferably larger than that of the pallet. It is understood that the relative sizes of the collimator system and substrate may vary in alternate embodiments provided that the height of the collimator system is larger than the height of the pallet. The collimator 100 may be used with pallets of different sizes. If it is used with large pallets, it is contemplated that several separate collimators, or a single collimator grid extending the length and width of the sputtering chamber wall, may be used.

During sputtering, target atoms are continuously deposited on the exposed surfaces of chamber walls in the sputtering system. After many passes through the sputtering process, the accumulated target atoms on the chamber walls will be released and contaminate substrates currently passing through the sputtering system. To avoid possible contamination of substrates due to target atom accumulation on the chamber walls during the sputtering process, the collimator 100 includes a collimator shield 106 as shown in FIG. 4. The collimator shield also supports a collimator honeycomb 108, as explained hereinafter.

The collimator shield 106 is formed as a series of panels 110 which define a rectangular tube. The rectangular tube includes an inner end 112 (nearest the substrate) which supports the collimator honeycomb 108, and an outer end 114 (nearest the target). Also located at the inner end is an outwardly extending flange 116 which is circumjacent about the inner end.

The outer end 114 of the rectangular tube includes a frame 118 defining an opening 120 therethrough for allowing the target atoms to pass through during the sputtering process. The frame 118 functions to limit the area of deposition of the target atoms. The shields also prevent the atoms from adjacent targets reaching on the substrate currently in front of the target.

The collimator shield 106 is preferably made out of a metal such as stainless steel. It is understood that the collimator shield may also be made of other materials, including aluminum, copper and titanium, in alternative embodiments. The particular material used depends upon the material being sputtered, and the adherence characteristics of the sputtered atoms. Moreover, the panels 110 of the rectangular tube, the flange 116 and the frame 118 should be substantially smooth in order to provide minimum surface area and low oxidation levels. It is understood that the shield may be formed to other shapes in alternative embodiments, such as square or circular shaped. The shape is preferably determined by the size and shape of the target. It is also understood that the collimator 100 may be formed without the flange and/or the frame in alternate embodiments.

As is further shown in FIGS. 3 and 4, the collimator honeycomb 108 is also located at the inner end 112 of the collimator 100. In order to ensure that the collimator honeycomb is effective over the entire height of the pallet, the collimator honeycomb is preferably larger than the height of the pallet and complements the shape of the collimator shield 106. The collimator honeycomb 108 is comprised of a plurality of collimators 122 which are preferably identical to each other. In a preferred embodiment, the collimators 122 may be formed of a metal such as stainless steel, but it is understood that the collimators 122 may also be made of other materials, including aluminum, copper and titanium, in alternative embodiments.

As shown in FIG. 4, in an embodiment of the present invention, the collimators have a hexagonal cross-section taken from a perspective perpendicular to the substrate. It is understood that the cross-section of the collimators may be other shapes, such as rectangular, triangular, octagonal or various other geometries. It is also understood that one or more of the collimators 122 may have a dissimilar size and/or configuration than one or more other collimators 122. The collimators include walls which are substantially planar surfaces having minimal thickness. The walls are oriented perpendicular to the substrates on the pallet.

With such an orientation, particles traveling substantially perpendicular paths will reach the substrate without contacting the walls of a collimator 122, but particles traveling along substantially oblique paths will contact the collimator walls and be blocked from reaching the substrate. The minimum angle that a target atom may assume upon leaving the target, and still contact the substrate is α2. In a preferred embodiment, α2 ranges between approximately 42° and 60° and is preferably more than about 45°. It is understood that α2 may be above or below that range in alternative embodiments.

Up to this point, the collimator 100 has been described as including a single level of collimator honeycombs 108. However, it is understood that the collimator 100 may include more than one collimator honeycomb 108 such that one is positioned adjacent to and spaced apart from the other. In addition, the collimators of a first honeycomb may be staggered with respect to the collimators of a second honeycomb (i.e., one honeycomb level is shifted to the left or right and/or up or down with respect to a second honeycomb level from the perspective shown in FIG. 4). It is further contemplated that first and second collimator honeycombs 108 may be staggered as described above, and also partially coplanar. That is, the staggered honeycombs also overlap so that the honeycomb nearest the substrate has an outer bottom edge farther away from the substrate than an inner top edge of the other honeycomb.

EXAMPLE

FIGS. 5 through 10 illustrate the comparison of magnetic properties and recording performances of a substrate deposited with the collimator 100 of the present invention on one side (Side A) of the substrate and a conventional shield on a second side (Side B) of the substrate.

In the example, a rigid magnetic recording substrate with identical targets on both sides of the substrate was deposited in an in-line pass-by PVD sputtering system. Both sides of the substrate were deposited simultaneously.

As depicted in the charts, four kinds of film structures were investigated and deposited with direct current (DC) magnetron sputtering. "CrV-Co-alloy" represents the medium with Co-alloy magnetic layer and CrV underlayer. "NiAl, CrV, & Co-alloy" represent the medium with Co-alloy magnetic layer, CrV underlayer, and NiAl seed layer. "NiPOx-CrV-Co-alloy" represents the medium with Co-alloy magnetic layer and CrV underlayer deposited on surface-oxidized NiP layer. "NiPOx-NiAl-CrV-Co-alloy" represents the medium with Co-alloy magnetic layer, CrV underlayer, and NiAl seed layer and deposited on surface-oxidized NiP layer. The composition of the film structures in atomic percentage are shown in Table 1.

TABLE 1

| Layer | Nip | NiAl | CrV | Co-alloy |
|---|---|---|---|---|
| Composition | 75% Ni, 25% P | 50% Ni, 50% Al | 80% Cr, 20% V | 73% Co, 15% Cr, 8% Pt, 4% Ta |

The recording performances were tested with a Guzik 1601 read write analyzer. The Guzik 1601 was connected to a Guzik 1701 spin stand employing a magnetoresistive head operating at 4500 rotations per minute (rpm) and a recording density of 260 thousands of flux reversal per inch (KFCI).

The figures show that the remanent coercivity, remanent coercivity squareness, and signal-to-medium noise ratio of the substrate deposited with collimator 100 of the present invention are much higher than those of the substrate deposited with conventional shields. The modulation of the read-back signal, the relative variation of the remanent coercivity (dHr) and PW50 of such media deposited with the collimator 100 according to the present invention were also significantly reduced.

Figure 9:
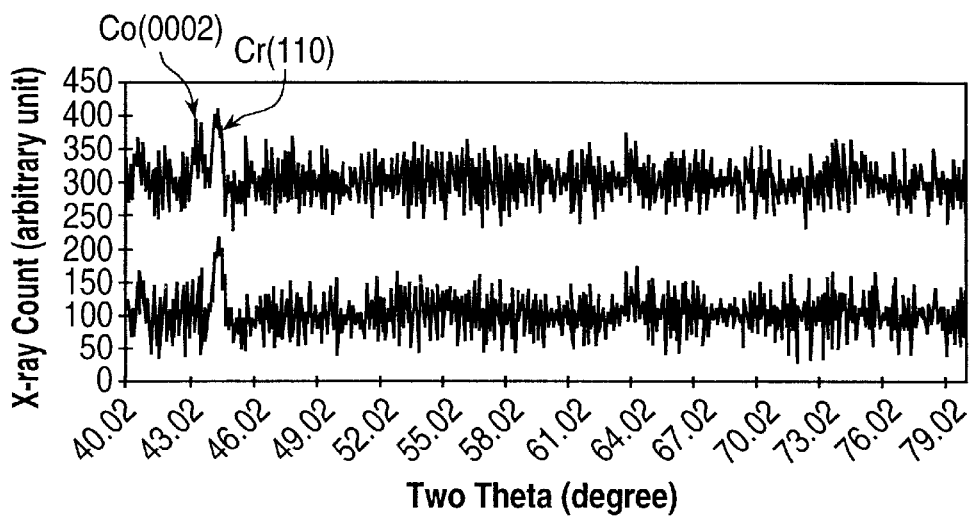
FIG. 9 is a graph comparing the X-ray diffraction patterns of glass-ceramic/CrV/CoCrPtTa films deposited with the conventional shield and the collimator system for CoCrPtTa according to the present invention.
Figure 10:
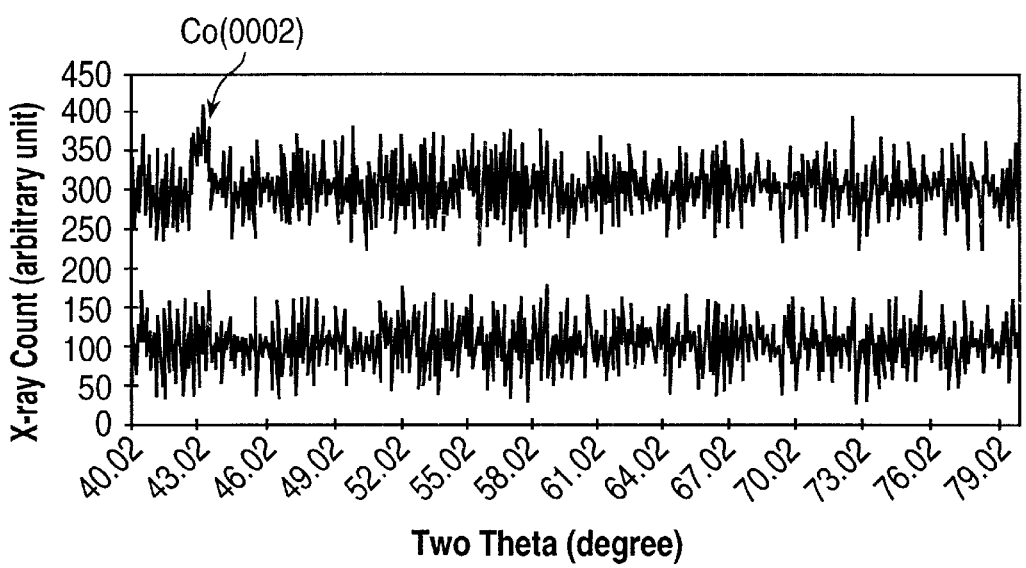
FIG. 10 is a graph comparing the X-ray diffraction patterns of glass-ceramic/NiPOx/NiAl/CrV/CoCrPtTa films deposited with the conventional shield and the collimator system for NiAl, CrV, and CoCrPtTa according to the present invention.

FIG. 9 depicts the X-ray diffraction patterns of glass-ceramic/CrV/CoCrPtTa disk. FIG. 10 depicts the X-ray diffraction patterns of glass-ceramic/CrV/CoCrPtTa disk. The patterns on the top of FIGS. 9 and 10 were obtained from the substrate which was deposited using conventional shields. The patterns on the bottom of the figures were obtained from the substrate deposited using the collimator system. In FIG. 9, the collimator was used for CoCrPtTa deposition only. In FIG. 10, the collimators were used for NiAl, CrV, and CoCrPtTa deposition. The undesirable Co (0002) crystallographic orientation of the media was significantly suppressed with use of the collimator 100. This is one of the reasons which accounts for a higher recording density and improved read/write performance of a recording disk fabricated using the collimator 100 according to the present invention.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

What is claimed is:

1. A collimator system used in an in-line, pass-by sputtering system for the manufacture of a recording medium of a disk drive, the collimator system comprising:

means for improving at least one recording performance characteristic from a group of performance characteristics including signal modulation, coercivity, coercivity squareness, signal-to-medium noise ratio and sharpness of output signal; and said means including a collimator shield and a collimator honeycomb for eliminating low incident deposition angles of particles which are dislodged from a target and emitted to a surface of a substrate.

2. A collimator system for improving magnetic properties of a recording medium in an in-line, pass-by sputtering system, the collimator system comprising:

a collimator shield for reducing low incident deposition angles of particles which are dislodged from a target and emitted to a surface of a substrate; and a plurality of adjoined collimators for further reducing the low incident deposition angles;

said collimator shield and plurality of adjoined collimators improving at least one of a signal modulation, coercivity, coercivity squareness, signal-to-medium noise ratio and sharpness of output signal of the recording medium.

3. A collimator system as recited in claim 2, wherein said collimator honeycomb prevents particles from depositing on the recording medium at an incident angle lower than approximately 42°.

4. A collimator system as recited in claim 2, wherein a collimator of said plurality of collimators are honeycomb-shaped.

5. A collimator system as recited in claim 2, wherein a collimator of said plurality of collimators are rectangular-shaped.

6. A collimator system as recited in claim 2, wherein a collimator of said plurality of collimators are triangular-shaped.

7. A collimator system as recited in claim 2, wherein said plurality of collimators comprise a first group of collimators and a second group of collimators, said first group of collimators being closer to the recording medium than said second group of collimators.

8. A collimator system used in an in-line, pass-by sputtering system for the manufacture of a recording medium of a disk drive, the collimator system comprising:

a shield for reducing low incident deposition angles of particles which are dislodged from a target and emitted to a surface of a substrate; and a plurality of adjoined collimators for further reducing the low incident deposition angles;

said shield and plurality of adjoined collimators improving a signal modulation, coercivity, coercivity squareness, signal-to-medium noise ratio and sharpness of output signal of the recording medium.

9. A collimator system as recited in claim 8, wherein said collimator honeycomb prevents particles from depositing on the recording medium at an incident angle lower than approximately 42°.

10. A collimator system as recited in claim 8, wherein a collimator of said plurality of collimators are honeycomb-shaped.

11. A collimator system as recited in claim 8, wherein a collimator of said plurality of collimators are rectangular-shaped.

12. A collimator system as recited in claim 8, wherein a collimator of said plurality of collimators are triangular-shaped.

13. A collimator system as recited in claim 8, wherein said plurality of collimators comprise a first group of collimators and a second group of collimators, said first group of collimators being closer to the recording medium than said second group of collimators.

* * * * *